United States Patent
Wu

(10) Patent No.: US 7,672,131 B2
(45) Date of Patent: Mar. 2, 2010

(54) HEAT SINK ASSEMBLY AND METHOD MANUFACTURING THE SAME

(75) Inventor: Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 145 days.

(21) Appl. No.: 11/848,189

(22) Filed: Aug. 30, 2007

(65) Prior Publication Data

US 2009/0059526 A1 Mar. 5, 2009

(51) Int. Cl.
*H05K 7/20* (2006.01)
*F28D 15/00* (2006.01)

(52) U.S. Cl. ............. 361/700; 361/679.47; 361/679.52; 361/703; 361/704; 165/104.33; 165/185; 174/15.2

(58) Field of Classification Search ................................
361/679.52–679.54, 687, 699–704, 709–710,
361/718–719, 679.47; 165/80.4, 80.5, 104.33,
165/185; 174/15.2
See application file for complete search history.

(56) References Cited

U.S. PATENT DOCUMENTS

| 6,542,364 | B2 * | 4/2003 | Lai et al. ..................... 361/697 |
| 7,331,379 | B2 * | 2/2008 | Chen et al. ............. 165/104.33 |
| 7,509,996 | B2 * | 3/2009 | Peng ......................... 165/80.3 |
| 2007/0012428 | A1 | 1/2007 | Wu et al. |
| 2007/0147006 | A1 * | 6/2007 | Peng ......................... 361/709 |

\* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat sink assembly includes a base plate, a fin group and a heat pipe thermally connecting the base plate with the fin group. The fin group includes a plurality of fins. The heat pipe includes a straight evaporating section contacting with the base plate, a first condensing section extending upwardly from an end of the evaporating section and through the fins, a second condensing section bent downwardly from a free end of the first condensing section and through the fins, and a third condensing section extending upwardly from an opposite end of the evaporating section and through the fins. Periphery walls of at least two of the first, second and third condensing sections substantially totally contact with the fins to increase a contact area between the heat pipe and the fins.

2 Claims, 4 Drawing Sheets

HEAT SINK ASSEMBLY AND METHOD MANUFACTURING THE SAME

BACKGROUND OF THE INVENTION

1. Field of the Invention

The present invention relates to a heat sink assembly, and more particularly to a heat sink assembly with a heat pipe, and to a method for manufacturing the same.

2. Description of Related Art

A computer central processing unit (CPU) is the core controller of electrical signals in the contemporary personal computers. Continued development of the CPUs has enabled them to perform more and more functions. Heat generated by the CPUs has thus increased enormously. Such heat can adversely affect the operational stability of the computers. Measures must be taken to efficiently remove the heat from the CPU. Typically, a heat sink with heat pipes having great heat conductivity is mounted on the CPU to remove the heat therefrom.

A related heat sink with a heat pipe includes a plate-type base, a plurality of fins mounted on the base and a heat pipe thermally connecting the base and the fins. The heat pipe includes an evaporating portion contacting with a top of the base and a pair of condensing portions connecting with the evaporating portion and extending through the fins. In use, the heat sink is mounted on an electronic component, and heat generated by the electronic component is transferred to the evaporating portion of the heat pipe via the base. The heat absorbed by the evaporating portion is subsequently transferred to the fins via the condensing portions of the heat pipe and is then dissipated to the atmosphere. However, due to a contact area between the heat pipe and the fins is small, a heat transferring speed from the base to a top of the fins is too slow to meet the heat dissipation requirement for the up-to-date CPUs.

What is needed, therefore, is a heat sink assembly with heat pipes having a large contact area with fins of the heat sink assembly to maximize the heat-dissipating efficiency thereof.

SUMMARY OF THE INVENTION

A heat sink assembly includes a base plate, a fin group and a heat pipe thermally connecting with the base plate and the fin group. The fin group includes a plurality of fins. The heat pipe includes a straight evaporating section contacting with the base plate, a first condensing section extending upwardly from an end of the evaporating section and through the fins, a second condensing section bent downwardly from a free end of the first condensing section and through the fins, and a third condensing section extending upwardly from an opposite end of the evaporating section and fitted in a cutout recessed from a side of each of the fins. Periphery walls of the first and second condensing sections substantially wholly contact with the fins to increase a contact area between the heat pipe and the fins.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
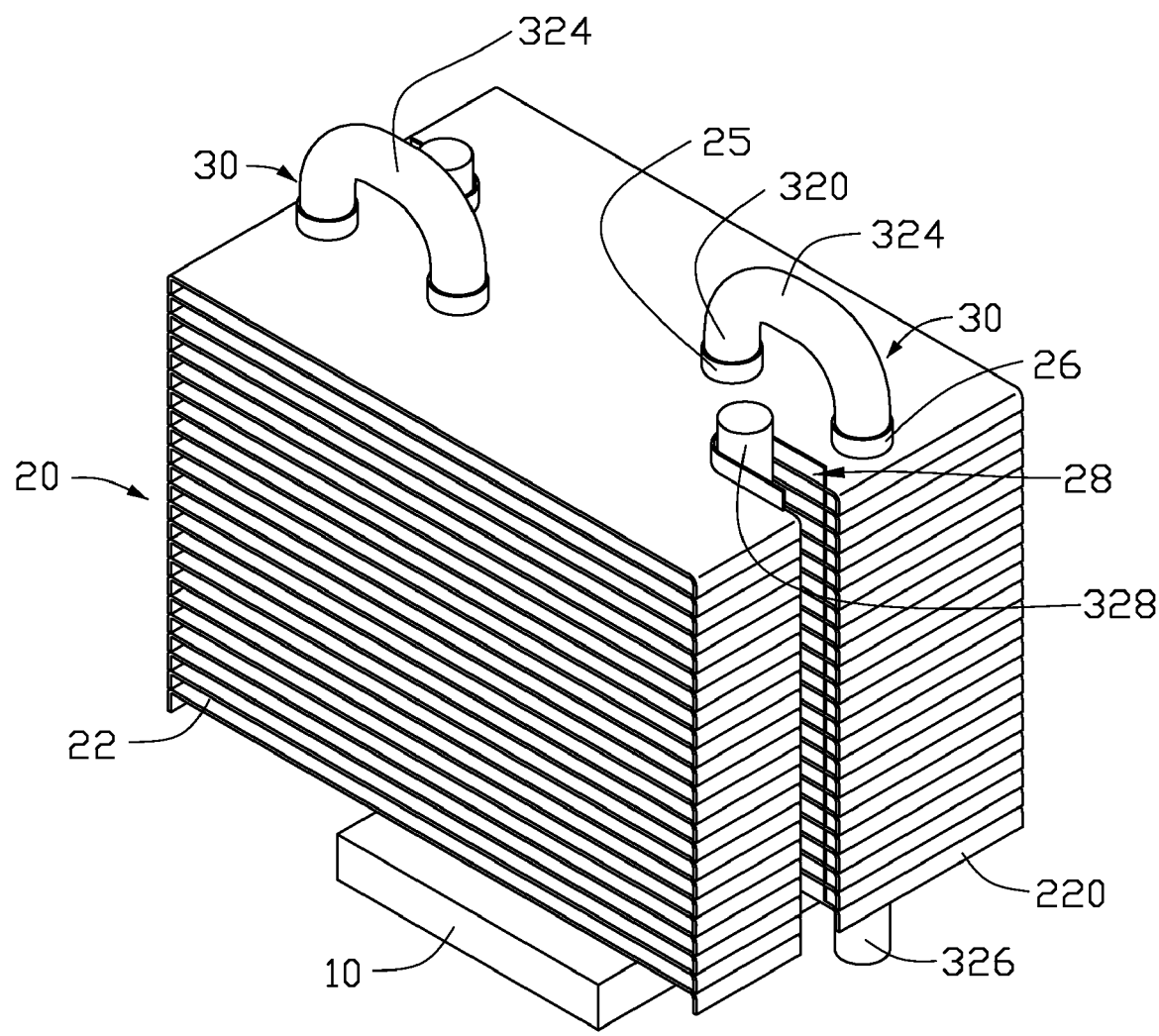
FIG. 1 is an assembled view of a heat sink assembly in accordance with a first embodiment of the present invention.
Figure 2:
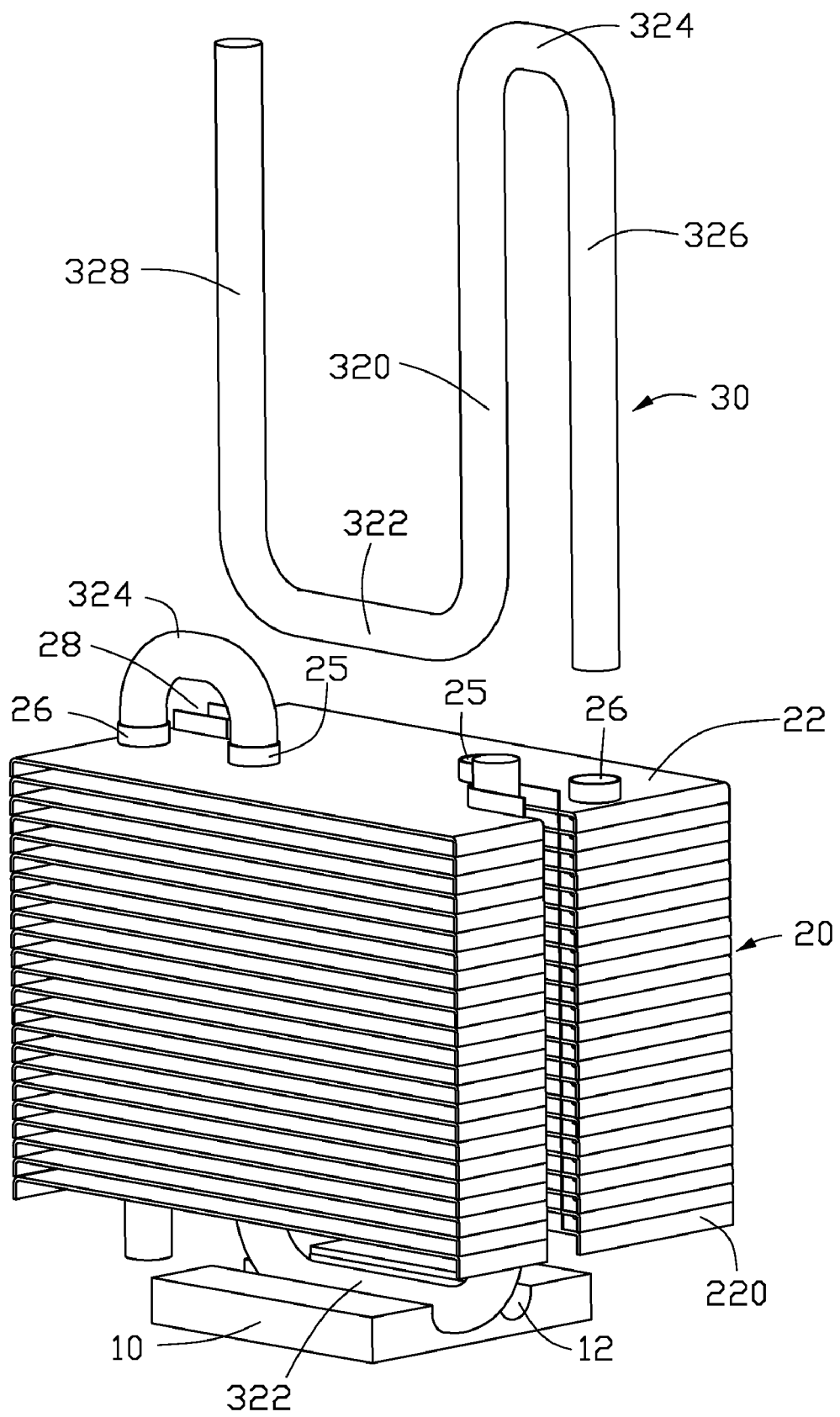
FIG. 2 is a partially exploded view of FIG. 1.

Referring to FIGS. 1 and 2, a heat sink assembly of a preferred embodiment of the invention is used for dissipating heat from an electronic component (not shown) mounted on a printed circuit board (not shown). The heat sink assembly comprises a base plate 10, a fin group 20, and two heat pipes 30 thermally connecting the fin group 20 and the base plate 10.

The base plate 10 is a rectangular metal plate having good heat conductivity, and has a bottom face (not labeled) for contacting with the electronic component and a top face (not labeled) opposite to the bottom face. A pair of adjoining grooves 12 are defined at the top surface of the base plate 10 for receiving the heat pipes 30 therein. The grooves 12 are parallel to each other. The bottom face of the base plate 10 is for thermally engaging with the electronic component mounted on the printed circuit board.

The fin group 20 comprises a plurality of fins 22 arranged above the top face of the base plate 10 for dissipating heat transferred from the base plate 10 to the fin group 20 by the heat pipes 30. Each of the fins 22 has a rectangular shape and is made from a metal sheet. The fins 22 define two groups of mounting holes (not labeled) therein. Each heat pipe 30 is received in each corresponding group of mounting holes. The two groups of mounting holes are parallel to each other. Each group of mounting holes comprises a first and a second through holes 25, 26 and a first cutout 28. The first cutout 28 has a U-shaped configuration formed by stamping and recessing a lateral side of each of the fins 22. The first and the second through holes 25, 26 and the first cutout 28 are separated from one another. In one of the groups of mounting holes, the first through hole 25 and the first cutout 28 are separately located at opposite sides of the fin group 20, and the second through hole 26 is located between the first through hole 25 and the first cutout 28 and adjacent to the first through hole 25. The two groups of mounting holes are symmetrical about a center of the fins 22. Two flanges 220 perpendicularly extend from opposite lateral sides of each of the fins 22, respectively. The flanges 220 contact each other at uniform intervals; thus, a plurality of channels are defined in the fin group 20 to receive the heat pipes 30.

Each of the heat pipes 30 is S-shaped and comprises a horizontal evaporating section 322 and three vertical condensing sections, i.e., a first condensing section 320, a second condensing section 326 and a third condensing section 328. The first, second and third condensing sections 320, 326, 328 are parallel to each other and perpendicular to the evaporating section 322. The evaporating section 322 is received and soldered in the groove 12 of the base plate 10. The first condensing section 320 extends upwardly from an end of the evaporating section 322 and is received and soldered in the first through hole 25. The second condensing section 326 bends downwardly from a free end of the first condensing section 320 and is received and soldered in the second through hole 26. The third condensing section 328 extends upwardly from an opposite end of the evaporating section 322 and is received and soldered in the first cutout 28. The heat pipe 30 further comprises a connecting section 324 parallel to the evaporating section 322. The connecting section 324 connects the first and the second condensing sections 320, 326 and is located a top the fin group 20.

A method for manufacturing the above-described heat sink assembly comprises following steps: (1) offering a fin group 20 having a plurality of single fins 22 with a first cutout 28 defined at a lateral side of each fin 22 of the fin group 20; (2) offering a straight heat pipe 30; (3) bending the heat pipe 30 to have a U-shaped configuration (not labeled) in such a manner that the heat pipe 30 comprises a first and a second condensing sections 320, 326, and the first condensing section 320 having a length much longer than that of the second condensing section 326; (4) extending the first and the second condensing sections 320, 326 through the fins 22; (5) bending a portion of the first condensing section 320 extending downwardly beyond the fins 22 to form a horizontal evaporating section 322 parallel to the fins 22; (6) bending a portion of the evaporating section 322 located just below the first cutout 28 upwardly to form a third vertical condensing section 328 which is fitted in the first cutout 28; (7) providing a base plate 10 having a groove 12 and embedding the evaporating section 322 of the heat pipe 30 into the groove 12; and (8) soldering the fins 22, the heat pipe 30 and the base plate 10 together.

According to the present invention, the heat sink assembly manufactured by this method has the first and the second condensing sections 320, 326 substantially wholly contacting with the fins 22, whereby a contacting area between the heat pipe 30 and the fins 22 is increased. Thus, heat generated by the electronic component, which is absorbed by the base plate 10 and is rapidly transferred from the base plate 10 to the fins 22 via the heat pipe 30 and is quickly dissipated to the atmosphere.

Figure 3:
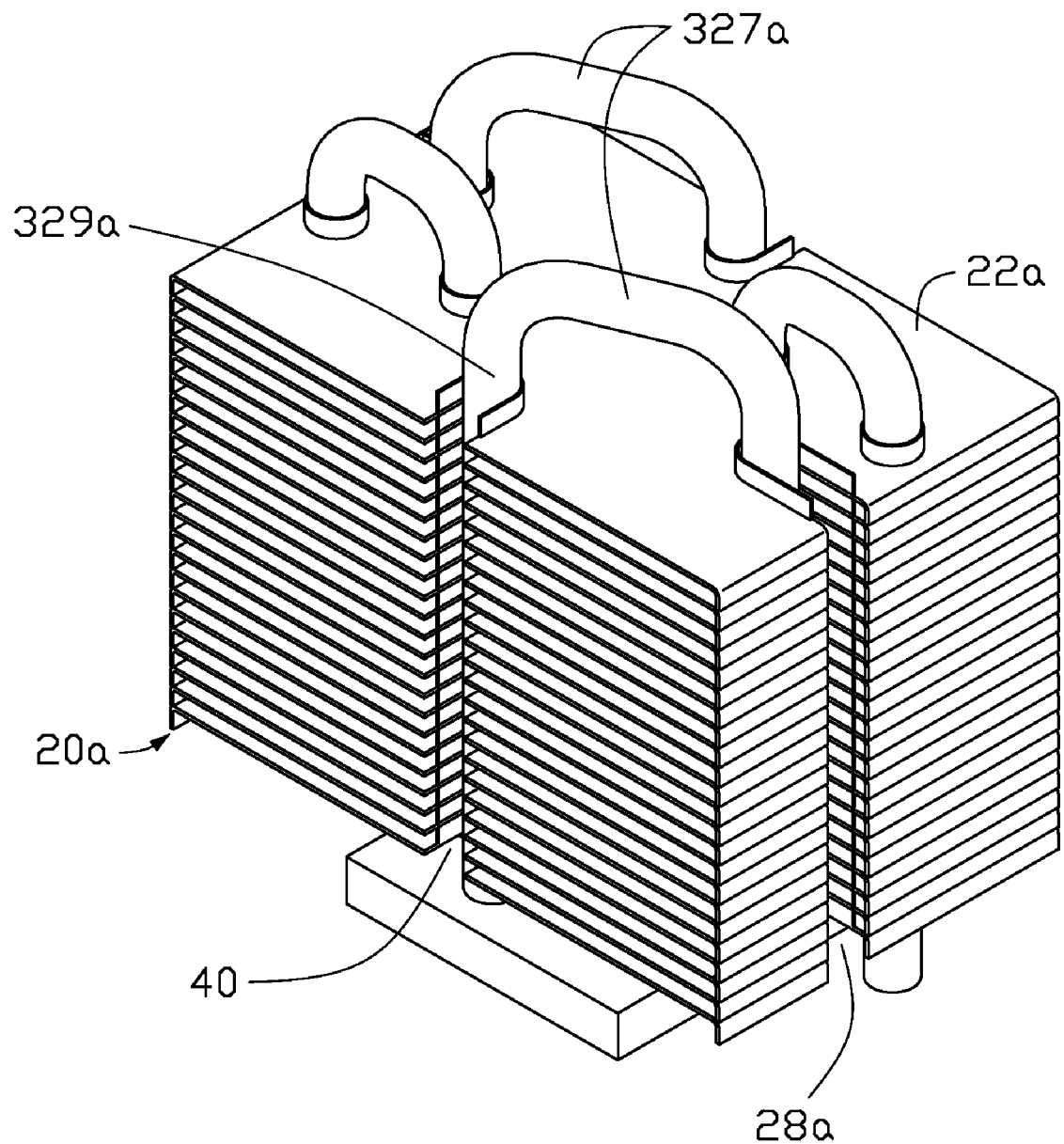
FIG. 3 is an assembled view of a heat sink assembly in accordance with a second embodiment of the present invention.
Figure 4:
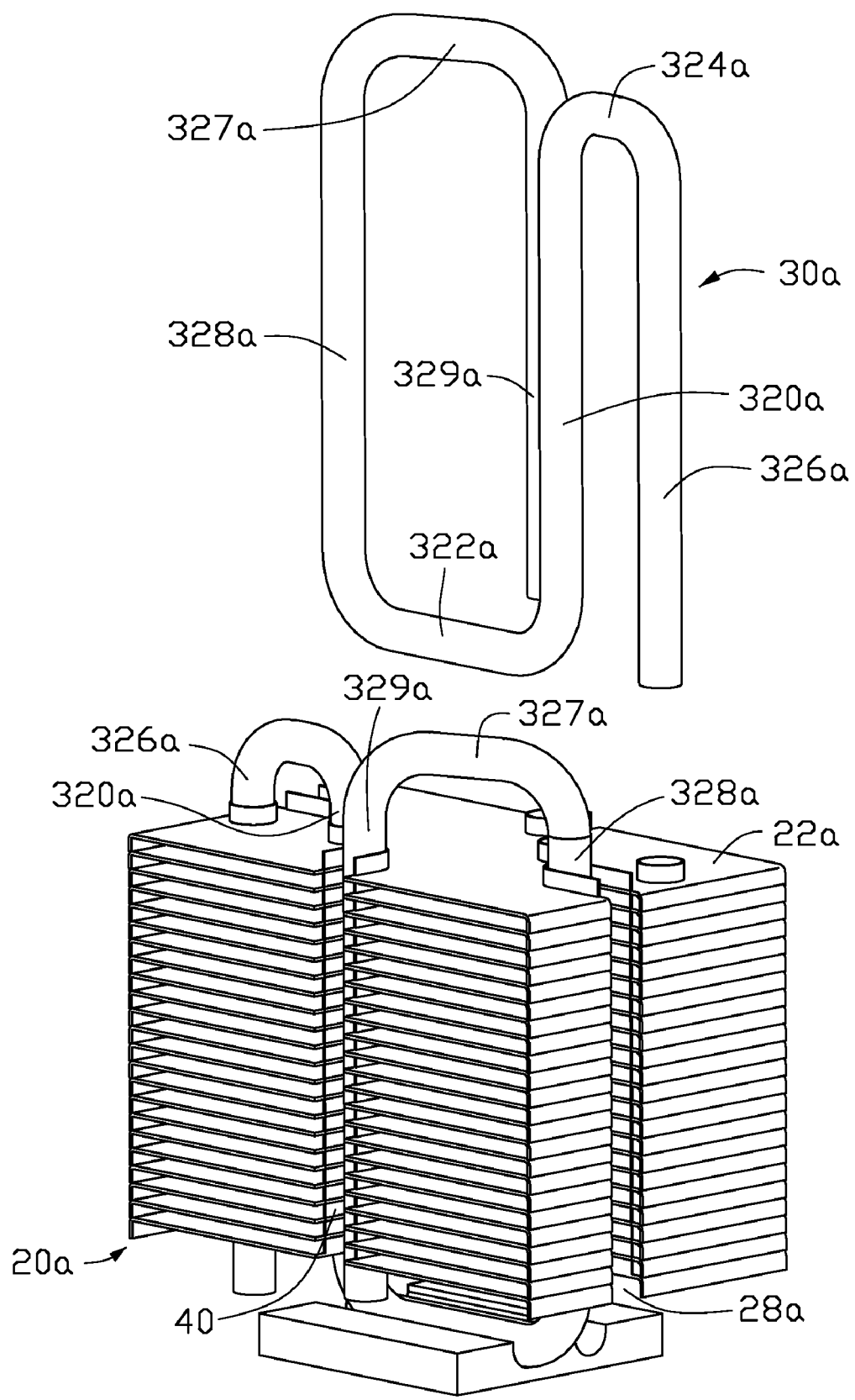
FIG. 4 is a partially exploded view of FIG. 3.

Referring to FIGS. 3 and 4, a heat sink assembly of a second embodiment of the present invention is shown. The heat sink assembly is similar to the heat sink assembly of the first embodiment of the present invention and also includes a base plate 10. The heat sink assembly further comprises a fin group 20a and a heat pipe 30a different from the fin group 20 and the heat pipe 30 of the first embodiment. The fin group 20a further defines a second cutout 40 at a side adjacent to the first cutout 28a. The heat pipe 30a comprises three condensing sections 320a, 326a, 328a, an evaporating section 322a and a connecting section 324a, which are the same as the heat pipe 30 of the first embodiment. A difference between the heat pipe 30a and the heat pipe 30 is that the heat pipe 30a further comprises a fourth condensing section 329a bent downwardly from a free end of the third condensing section 328a and received and soldered in the second cutout 40. The fourth condensing section 329a is parallel to the third condensing section 328a. A connecting section 327a connects the third and the fourth condensing sections 328a, 329a and is parallel to the evaporating section 322a.

A method for manufacturing the heat sink assembly of the second embodiment comprises following additional steps between steps (7) and (8) of the first embodiment: (1) bending a portion of the third condensing section 328a extending upwardly beyond the fins 22a to form a horizontal connecting section 327a; (2) bending a portion of the connecting section 327a located just above the second cutout 40 downwardly to form a vertical fourth condensing section 329a which is fitted in the second cutout 40. In the second embodiment, the fin group 20a has been formed with the second cutout 40, in addition to the first cutout 28.

According to the present invention, the heat sink assembly manufactured by this method has four condensing sections 320a, 326a, 328a, 329a contacting with the fins 22a; thus, the heat generated by the electronic component can be more rapidly transferred to the fins 22a.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly adapted for dissipating heat generated by an electronic component mounted on a printed circuit board, the heat sink assembly comprising:
    a base plate adapted for contacting with the electronic component;
    a fin group comprising a plurality of fins; and
    a heat pipe transferring heat from the base plate to the fin group, the heat pipe comprising a straight evaporating section contacting with the base plate, a first condensing section extending upwardly from an end of the evaporating section and through the fins, a second condensing section bent downwardly from a free end of the first condensing section and through the fins, a third condensing section extending upwardly from an opposite end of the evaporating section and through the fins, and a fourth condensing section extending downwardly from the third condensing section and through the fins, the first, second, third and fourth condensing sections located at different planes to contact different portions of the fin group;
    wherein periphery walls of at least two of the first, the second, the third and the fourth condensing sections substantially totally contact with the fins to increase a contact area between the heat pipe and the fins;
    wherein a first through hole and a second through hole and a first cutout and a second cutout are separately defined in each of the fins, the first condensing section is received in the first through hole, the second condensing section is received in the second through hole, the third condensing section is received in the first cutout, and the fourth condensing section is received in the second cutout, the first cutout is recessed from a side of each of the fins, and the second cutout is recessed from another side of each of the fins; and
    wherein the first and second cutouts both are U-shaped.

2. The heat sink assembly of claim 1, wherein the heat pipe has an additional connecting section connecting the third and fourth condensing sections, the additional connecting section being parallel to the evaporating section.

\* \* \* \* \*